United States Patent
Zeng et al.

(10) Patent No.: US 10,347,330 B2
(45) Date of Patent: Jul. 9, 2019

(54) SOLID STATE STORAGE DEVICE AND READING CONTROL METHOD THEREOF FOR READ RETRY PROCESS WITH OPTIMAL READ VOLTAGE SET

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Jen-Chien Fu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 491 days.

(21) Appl. No.: 15/013,023

(22) Filed: Feb. 2, 2016

(65) Prior Publication Data
US 2017/0125090 A1    May 4, 2017

(30) Foreign Application Priority Data

Oct. 28, 2015  (CN) .......................... 2015 1 0732764

(51) Int. Cl.
*G06F 11/10* (2006.01)
*G11C 16/26* (2006.01)
*G11C 29/52* (2006.01)
*G11C 11/56* (2006.01)
*G11C 16/28* (2006.01)
*G11C 16/34* (2006.01)

(52) U.S. Cl.
CPC ...... *G11C 11/5642* (2013.01); *G06F 11/1068* (2013.01); *G11C 16/26* (2013.01); *G11C 16/28* (2013.01); *G11C 29/52* (2013.01); *G11C 16/349* (2013.01); *G11C 16/3418* (2013.01)

(58) Field of Classification Search
None
See application file for complete search history.

(56) References Cited

U.S. PATENT DOCUMENTS

2015/0287453 A1* 10/2015 Wu et al. ............... G11C 16/26
                                                              365/185.03

* cited by examiner

*Primary Examiner* — Justin R Knapp
(74) *Attorney, Agent, or Firm* — WPAT, PC

(57) ABSTRACT

A reading control method for a solid state storage device includes following steps. While the solid state storage device is in an idle mode, a background monitoring operation is performed on the first block and the second block. Consequently, a first optimal read voltage set corresponding to the first block and a second optimal read voltage set corresponding to the second block are acquired. In reading operation, a default read voltage set is provided to the non-volatile memory to read a data of the first block. If a data of the first block is not successfully decoded, a read retry process is performed on the first block and the first optimal read voltage set is provided to the non-volatile memory to read the data of the first block.

14 Claims, 9 Drawing Sheets

SOLID STATE STORAGE DEVICE AND READING CONTROL METHOD THEREOF FOR READ RETRY PROCESS WITH OPTIMAL READ VOLTAGE SET

This application claims the benefit of People's Republic of China Application Serial No. 201510732764.4, filed Oct. 28, 2015, the subject matter of which is incorporated herein by reference.

FIELD OF THE INVENTION

The present invention relates to a solid state storage device and a control method thereof, and more particularly to a solid state storage device and a reading control method thereof.

BACKGROUND OF THE INVENTION

As is well known, solid state storage devices such as SD cards or solid state storage drives (SSD) are widely used in a variety of electronic devices. Generally, a solid state storage device comprises a controlling circuit and a non-volatile memory.

Moreover, a NAND-based flash memory is one kind of non-volatile memory. Depending on the amount of data to be stored, the NAND-based flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

FIG. 1 is a schematic functional block diagram illustrating a conventional solid state storage device. As shown in FIG. 1, the solid state storage device 10 is connected with a host 14 through an external bus 12. Generally, the external bus 12 is a USB bus, an SATA bus, a PCIe bus, or the like. Moreover, the solid state storage device 10 comprises a controlling circuit 101 and a non-volatile memory 105. The controlling circuit 101 is connected with the non-volatile memory 105 through an internal bus 107. According to a command from the host 14, the controlling circuit 101 stores the received write data into the non-volatile memory 105, or the controlling circuit 101 acquires a read data from the non-volatile memory 105 and transmits the read data to the host 14.

The controlling circuit 101 further comprises an error correction (ECC) unit 104 and a retry table 106. The ECC unit 104 is used for correcting the error bits of the read data. After the error bits of the read data are corrected, corrected read data are transmitted to the host 14. However, if the ECC unit 104 is unable to successfully correct all bits of the read data, the read data cannot output the read data to the host 14. Under this circumstance, the retry table 106 provides another read voltage to the controlling circuit 101. According to the read voltage, the controlling unit 101 performs a read retry operation on the non-volatile memory 105.

FIG. 2A schematically illustrates the architecture of cells in the non-volatile memory of the solid state storage device. The non-volatile memory 105 has a memory array composed of plural cells. Each cell includes a floating gate transistor. The memory array comprises plural word lines WL(n−1), WL(n) and WL(n+1) for controlling respective rows of cells. When one of the plural word lines is activated, a selected row corresponding to the activated word line is determined. According to the on/off states of the floating gate transistors of the cells in the selected row, the storing states of the cells are determined. Moreover, the cells are SLC, MLC or TLC cells.

Generally, the floating gate transistor of each cell has a floating gate to store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the solid state storage device, the amount of hot carriers to be injected into the floating gate is controlled by the controlling circuit 101, so that the threshold voltage ($V_{TH}$) of floating gate transistor is correspondingly changed. During a read cycle, the controlling circuit 101 provides a read voltage to the floating gate of the floating gate transistor and determines the storing state of the floating gate transistor by judging whether the floating gate transistor is turned on.

FIG. 2B schematically illustrates the threshold voltage distribution curves of the MLC flash memory in different storing states. Each cell of the MLC flash memory can be programed into one of four storing states E, A, B and C according to the amount of the injected hot carriers. Before the hot carriers are injected into the cell, the cell is in a storing state E. According to the number of hot carriers injected into the cell, the cell is in the storing state A, the storing state B or the storing state C. The cell in the storing state C has the highest threshold voltage. The cell in the storing state E has the lowest threshold voltage. After an erase cycle, the cell is returned to the storing state E where no hot carriers are injected into the cell.

Moreover, each cell of the SLC flash memory has two storing states, and each cell of the TLC flash memory has eight storing states. Hereinafter, only the cells of the MLC flash memory will be described. It is noted that the concepts of the present invention are also applied to the SLC flash memory and the TLC flash memory.

In practical, even if many cells are in the same storing state during the program cycle, the threshold voltages of these cells are not all identical. That is, the threshold voltages of these cells are distributed in a specified distribution curve with a median threshold voltage. As shown in FIG. 2B, the cells in the storing state E have a median threshold voltage $V_{THE}$ (e.g. 0V), the cells in the storing state A have a median threshold voltage $V_{THA}$ (e.g. 10V), the cells in the storing state B have a median threshold voltage $V_{THB}$ (e.g. 20V), and the cells in the storing state C have a median threshold voltage $V_{THC}$ (e.g. 30V). In other words, a greater number of the cells in the storing state A have the median threshold voltage $V_{THA}$ (e.g. 10V).

Please refer to FIG. 2B again. According to the above characteristics of the MLC flash memory, a read voltage set including three read voltages Vra, Vrb and Vrc is defined. During the read cycle, the controlling circuit 101 provides the three read voltages of the read voltage set to the word line in order to detect the storing states of the cells of the MLC flash memory.

For example, when the read voltage Vrb is provided to the non-volatile memory 105, a most significant bit (MSB) of the cell can be determined. If the threshold voltage of the cell is lower than the read voltage Vrb and the cell can be turned, the controlling circuit 101 judges that the MSB of the cell is "1". Whereas, if the threshold voltage of the cell is higher than the read voltage Vrb and the cell cannot be turned, the controlling circuit 101 judges that the MSB of the cell is "0". Similarly, after the read voltage Vra and the read voltage Vrc are provided to the non-volatile memory 105, a least significant bit (LSB) of the cell can be determined. Consequently, the storing state E is denoted as a logic state is "11", the storing state A is denoted as a logic state "10", the storing state B is denoted as the logic state "00", and the storing state C is denoted as the logic state "01".

Similarly, the controlling circuit 101 can employ one read voltage to determine two storing states of the SLC flash memory. Similarly, the controlling circuit 101 can use a read voltage set including seven read voltages to determine eight storing states of the TLC flash memory.

As mentioned above, the read voltages Vra, Vrb and Vrc are important for determining the storing states of the cells. However, after the non-volatile memory 105 has been used for a certain time period, the characteristics of the cells are subjected to changes. Under this circumstance, the threshold voltage distribution curves of the storing state of all cells in the non-volatile memory 105 are possibly changed, and the median threshold voltages are shifted. If the original read voltages Vra, Vrb and Vrc are still used to read the data of the non-volatile memory 105, the number of error bits increases. Since the number of the erroneously-judged cells increases, the ECC unit 104 cannot effectively correct the erroneously-judged cells. Under this circumstance, the controlling circuit 101 cannot output the corrected read data to the host 14.

For solving the above drawbacks, the controlling circuit 101 has a retry table. For example, the retry table contains plural read voltage sets stored in a memory. If the controlling circuit 101 confirms that a read retry operation is required, the controlling circuit 101 acquires another read voltage set including three read voltages Vra', Vrb' and Vrc' from the retry table 106. Moreover, the read voltages Vra', Vrb' and Vrc' are provided to the non-volatile memory 105 in order to read the data again.

FIG. 2C is a flowchart illustrating a decoding process of the conventional solid state storage device. Firstly, the controlling circuit 101 provides a default read voltage set including read voltages Vra, Vrb and Vrc to the non-volatile memory 105 in order to read data from the non-volatile memory 105 (Step S302). Then, the controlling circuit 101 judges whether the data is successfully decoded (Step S304).

If the data is successfully decoded by the ECC unit 104 in the Step S304, it means the error bits in the read data can be corrected. Consequently, the controlling circuit 101 outputs the read data (Step S310). Whereas, if the data is not successfully decoded in the Step S304, it means that the error bits in the read data cannot be effectively corrected. Consequently, the controlling circuit 101 performs a read retry process (Step S305).

In the read retry process Step S305, the controlling circuit 101 acquires an updated read voltage set including read voltages Vra', Vrb' and Vrc' from the retry table 106, and provides the updated read voltage set to the non-volatile memory 105 in order to read data from the non-volatile memory 105 (Step S306). Then, the controlling circuit 101 judges whether the data can be successfully decoded (Step S308).

For example, M read voltage sets have been previously listed and contained in the retry table 106. During the read retry process S305, the M read voltage sets are sequentially used as the updated read voltage sets and provided to the non-volatile memory 105. According to the updated read voltage sets, the controlling circuit 101 reads the data from the non-volatile memory 105 again. If the data is successfully decoded according to the updated read voltage sets, the controlling circuit 101 outputs the read data (Step S310) and ends the read retry process S305. Whereas, if the data is not successfully decoded according to all of the M read voltage sets, it means that the read retry process fails. Under this circumstance, the controlling circuit 101 generates a failed message to indicate that the read retry process fails (Step S312). In other words, the steps S306 and S308 are performed M times at most during the read retry process.

From the above discussions, if the data is successfully decoded according to the default read voltage set, the controlling circuit 101 will not perform the read retry process. Under this circumstance, all of the M read voltage sets in the retry table 106 are not used. On the other hand, if the controlling circuit 101 performs the read retry process, the M read voltage sets in the retry table 106 are possibly used.

Moreover, the M read voltage sets in the retry table 106 are provided by the manufacturer of the non-volatile memory 105. During the read retry process, the controlling circuit 101 sequentially reads the M read voltage sets from the retry table 106 and sequentially provides the M read voltage sets to the non-volatile memory 105. Since the read retry process is only able to sequentially provide the M read voltage sets to the non-volatile memory 105 but is unable to directly acquire the suitable read voltage set, the read retry process is time-consuming.

SUMMARY OF THE INVENTION

An embodiment of the present invention provides a reading control method for a solid state storage device. The solid state storage device includes a non-volatile memory with plural blocks. The plural blocks include a first block and a second block. The reading control method includes the following steps. While the solid state storage device is in an idle mode, a background monitoring operation is performed on the first block and the second block. Consequently, a first optimal read voltage set corresponding to the first block and a second optimal read voltage set corresponding to the second block are acquired. In reading operation, a default read voltage set is provided to the non-volatile memory to read a data of the first block, and a judging step is performed to judge whether the data of the first block is successfully decoded. If the data of the first block is not successfully decoded, a read retry process is performed on the first block and the first optimal read voltage set is provided to the non-volatile memory to read the data of the first block.

Another embodiment of the present invention provides a solid state storage device. The solid state storage device includes a non-volatile memory and a controlling circuit. The non-volatile memory includes plural blocks. The plural blocks include a first block and a second block. The controlling circuit is connected with the non-volatile memory. The controlling circuit includes an error correction unit and a retry table, and plural read voltage sets are contained in the retry table. When the solid state storage device is in an idle mode, the controlling circuit performs a background monitoring operation to acquire a first optimal read voltage set corresponding to the first block and a second optimal read voltage set corresponding to the second block. During a read retry process, the controlling circuit provides the first optimal read voltage set to the non-volatile memory to read a data of the first block.

A further embodiment of the present invention provides a reading control method for a solid state storage device. The solid state storage device includes a non-volatile memory with plural blocks. The plural blocks include a first block and a second block. The reading control method includes following steps. While the solid state storage device is in an idle mode, a background monitoring operation is performed on the first block and the second block. The background monitoring operation is performed by steps of providing X read voltage sets in a retry table to the non-volatile memory to read a data of the first block and correspondingly generate X decoding results, and determining one of the X read voltage sets as the first optimal read voltage set corresponding to the first block according to the X decoding results. When a read retry process is performed, and the first optimal read voltage set is provided to the non-volatile memory to read the data of the first block.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a solid state storage device and a reading control method thereof. The reading control method can be used to directly provide an appropriate read voltage set to perform a read retry process. Consequently, the read retry process is time-saving. The term "idle period" used herein indicates that no data are transmitted between the solid state storage device and a host. During the idle period, a controlling circuit performs a background monitoring operation on all blocks of a non-volatile memory. While the background monitoring operation is performed, read voltage sets previously listed and contained in a retry table are provided to blocks of the non-volatile memory by the controlling circuit. Then, the blocks are correlated with the corresponding optimal read voltage sets according to the generated data of the blocks. The optimal read voltage sets are selected from the retry table. The optimal read voltage sets for different blocks may be identical or different. While the host reads the read data of the solid state storage device and the read retry process is performed, the controlling circuit performs the read retry process according to the optimal read voltage sets of the corresponding blocks.

Figure 1:
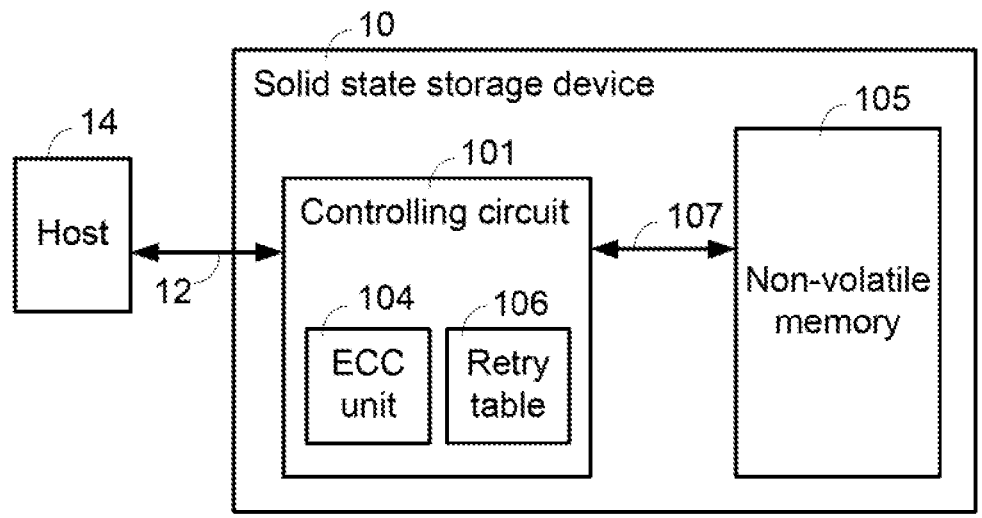
FIG. 1 (prior art) is a schematic functional block diagram illustrating a conventional solid state storage device.
Figure 2A:
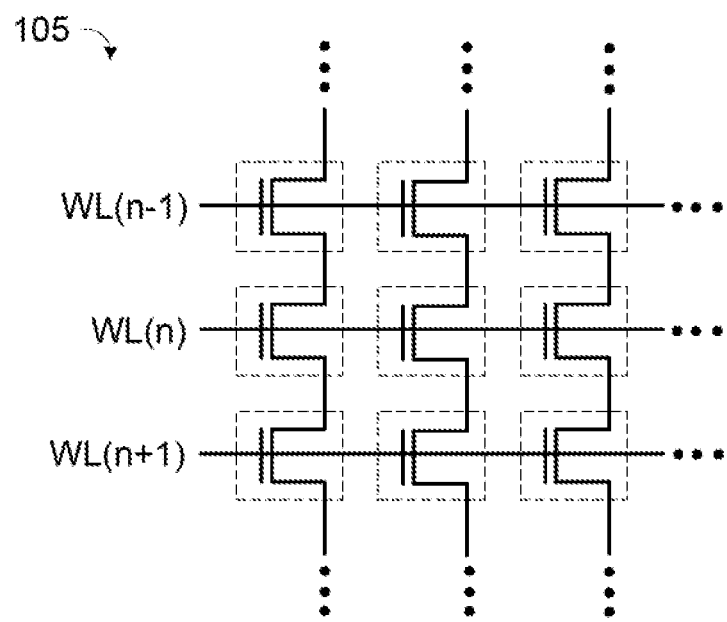
FIG. 2A (prior art) schematically illustrates the architecture of cells in the non-volatile memory of the solid state storage device.
Figure 2B:
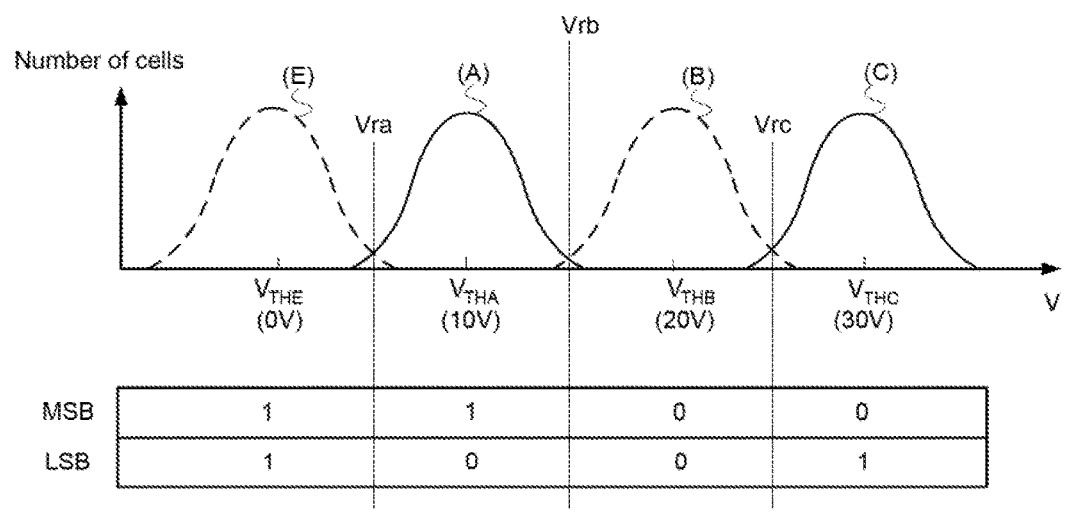
FIG. 2B (prior art) schematically illustrates the threshold voltage distribution curves of the MLC flash memory in different storing states.
Figure 2C:
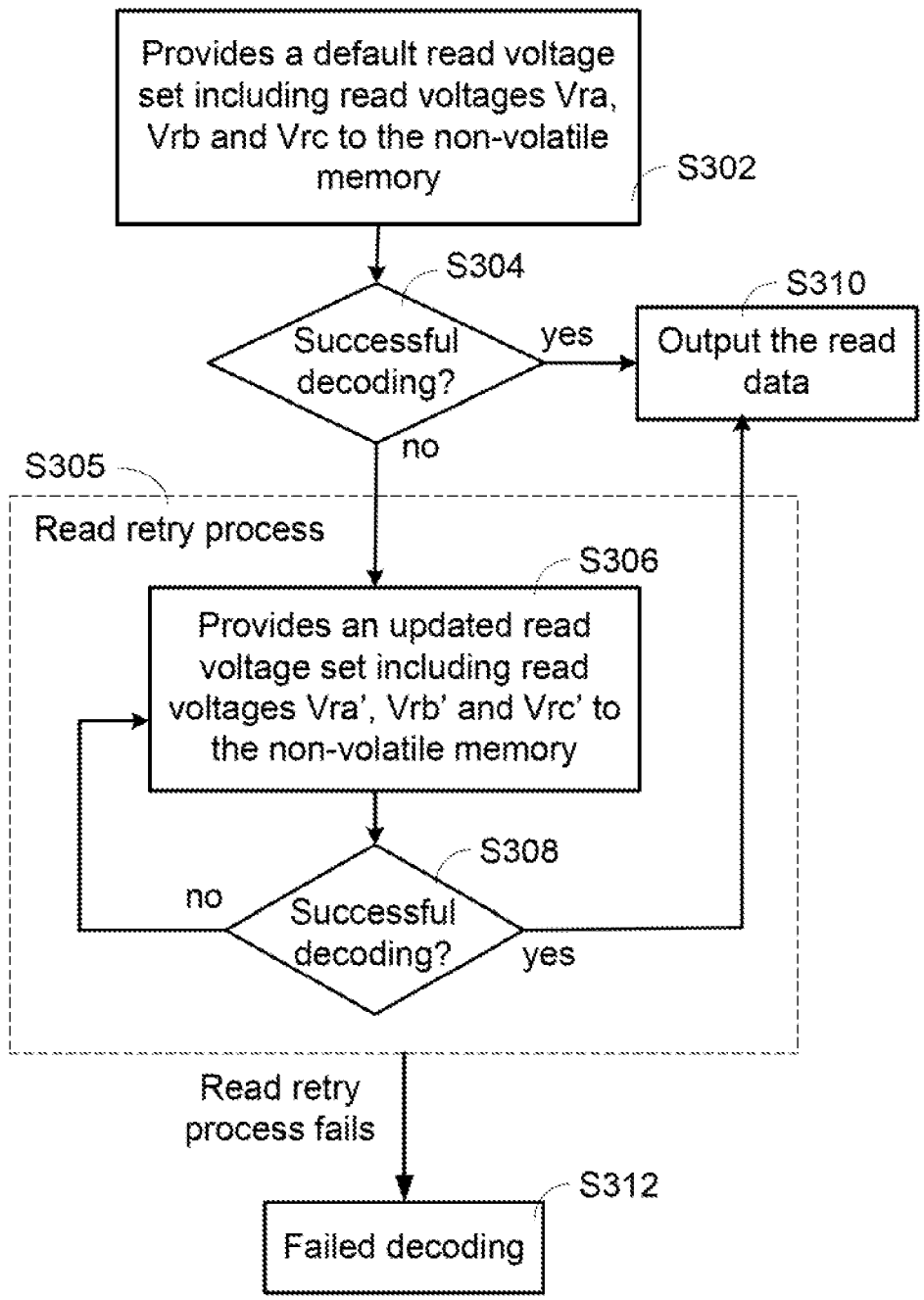
FIG. 2C (prior art) is a flowchart illustrating a decoding process of the conventional solid state storage device.
Figure 3:
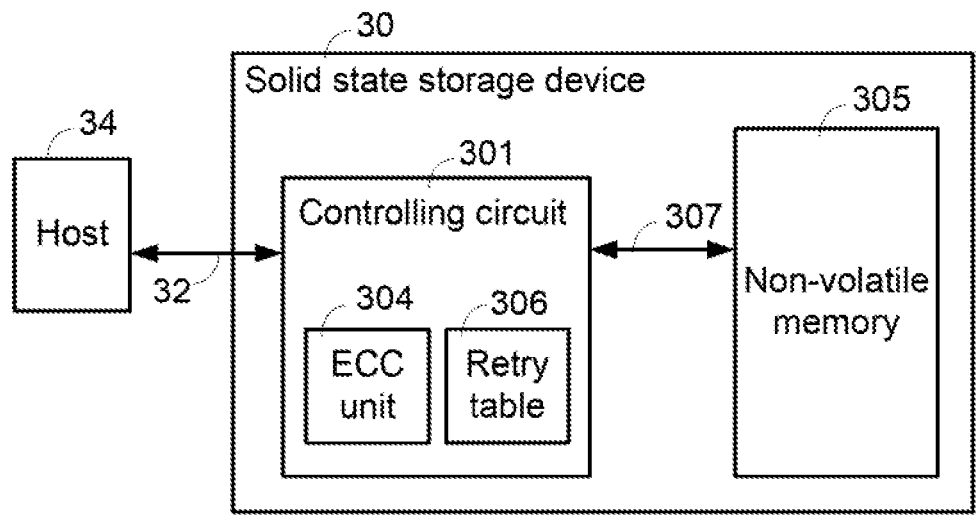
FIG. 3 is a schematic functional block diagram illustrating a solid state storage device according an embodiment of the present invention.

FIG. 3 is a schematic functional block diagram illustrating a solid state storage device according an embodiment of the present invention. As shown in FIG. 3, the solid state storage device 30 is connected with a host 34 through an external bus 32. Generally, the external bus 32 is a USB bus, an SATA bus, a PCIe bus, or the like. Moreover, the solid state storage device 30 comprises a controlling circuit 301 and a non-volatile memory 305. The controlling circuit 301 is connected with the non-volatile memory 305 through an internal bus 307. According to a command from the host 34, the controlling circuit 301 stores the received write data into the non-volatile memory 305, or the controlling circuit 301 acquires a read data from the non-volatile memory 305 and transmits the read data to the host 34.

The controlling circuit 301 further comprises an error correction (ECC) unit 304 and a retry table 306. The ECC unit 304 is used for correcting the error bits of the read data. After the error bits of the read data are corrected, corrected read data are transmitted to the host 34. Moreover, X read voltage sets have been previously stored in the retry table 306. During the idle period of the solid state storage device 30, the controlling circuit 301 performs the background monitoring operation according to the X read voltage sets. In addition, the X read voltage sets can be used in a read retry process.

Figure 4A:
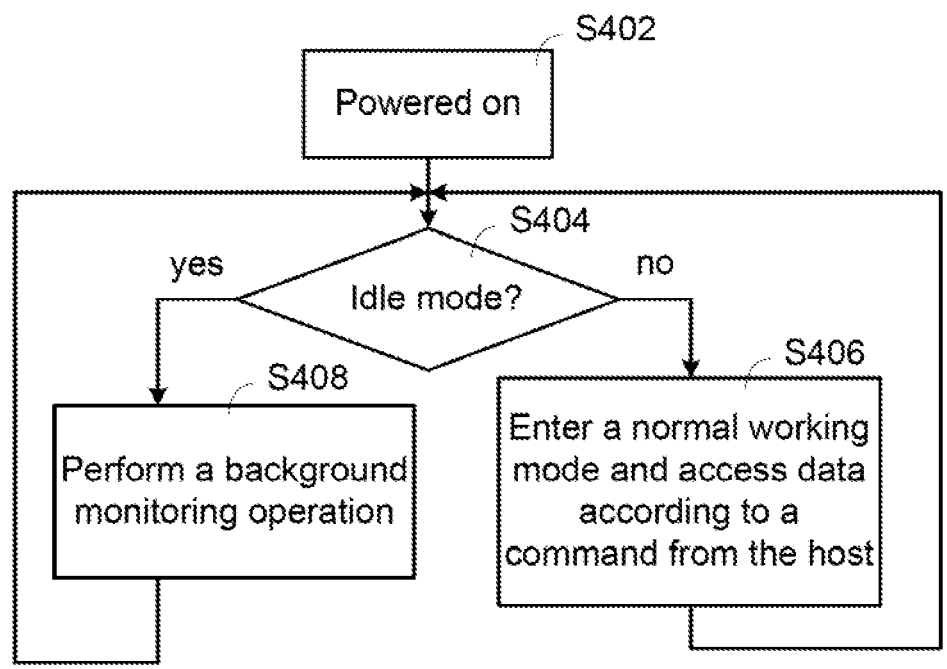
FIG. 4A is a flowchart illustrating the operations of the solid state storage device of the present invention.

FIG. 4A is a flowchart illustrating the operations of the solid state storage device of the present invention. After the solid state storage device 30 is powered on (Step 402), the controlling circuit 301 judges whether a data accessing action between the host 34 and the solid state storage device 30 is being performed. That is, the controlling circuit 301 judges whether the solid state storage device 30 is in an idle mode (Step S404). If the data accessing action is being performed, the solid state storage device 30 is not in an idle mode. Consequently, the solid state storage device 30 is in a normal working mode, and the solid state storage device 30 performs the data accessing action according to a command from the host 34 (Step S406). After the data accessing action according to the command is completed, the controlling circuit 301 continuously judges whether the solid state storage device 30 is in the idle mode (Step S404).

Whereas, if no data accessing action between the host 34 and the solid state storage device 30 is being performed, the solid state storage device 30 is in the idle mode. In the idle mode, the solid state storage device 30 performs a background monitoring operation (Step S408). While the background monitoring operation is performed, if the solid state storage device 30 receives the command for accessing data from the host 34, the solid state storage device 30 is no longer in the idle mode, and the background monitoring operation may be suspended.

Generally, the non-volatile memory 305 of the solid state storage device 30 contains plural blocks. In addition, each block contains plural pages. For example, the non-volatile memory 305 contains 1024 blocks, and each block contains 256 pages. Each page is typically 8 k bytes in size. Moreover, a codeword of the ECC unit 304 has a length of 1 k bytes. In other words, each page contains 8 codewords.

Figures 4B, 4C:
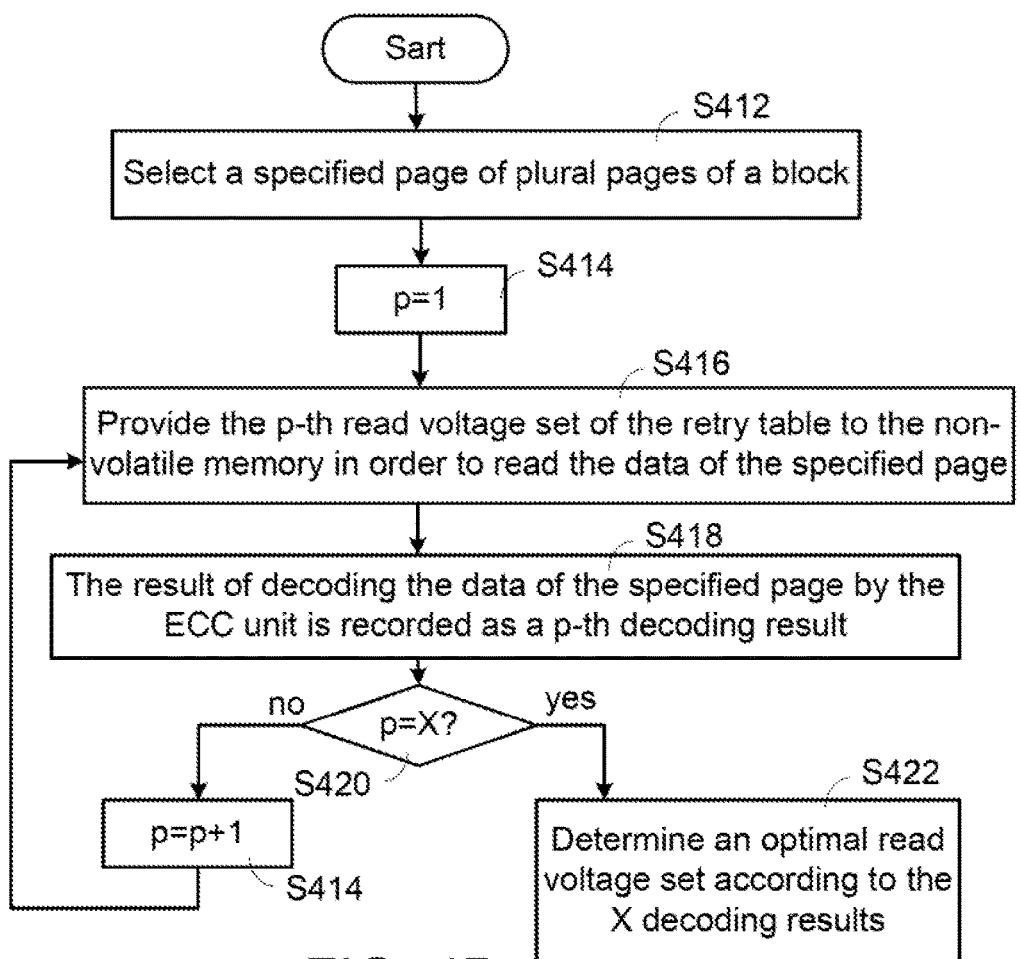
FIG. 4B is a flowchart illustrating a process of performing a background monitoring operation on one block according to an embodiment of the present invention.
FIG. 4C is table illustrating the relationships between read voltage sets, uncorrectable codewords and error bits for determining an optimal read voltage set.

In an embodiment, the background monitoring operation is performed in a block-wise fashion. FIG. 4B is a flowchart illustrating a process of performing a background monitoring operation on one block according to an embodiment of the present invention. In this embodiment, X read voltage sets have been previously stored in the retry table 306.

Firstly, a specified page of plural pages of a block is selected (Step S412). Then, set p=1 (Step S414), and a p-th read voltage set in the retry table 306 is provided to the non-volatile memory 305 to read the data of the specified page (Step 416). Then, the data of the specified page is decoded by the ECC unit 304, and the result of decoding the data of the specified page is recorded as a p-th decoding result (Step 418).

Then, a step S420 is performed to judge whether p is equal to X. If p is not equal to X, set p=p+1 (Step S414). After the step S414, the steps S416 and S418 is repeatedly done. Whereas, if p is equal to X, it means that X read voltage sets of the retry table 306 have been used to read the data of the specified page and X decoding results have been generated. Consequently, the controlling circuit 301 determines an optimal read voltage set according to the X decoding results (Step S422). The optimal read voltage set is recorded and will be used in the read retry process.

In case that the non-volatile memory 305 has 1024 blocks, the background monitoring operation as described in FIG. 4B has to be performed 1024 times. However, as described in FIG. 4A, the solid state storage device 30 may be switched from the idle mode to the normal working state while the background monitoring operation is performed. After the solid state storage device 30 is switched from the idle mode to the normal working state, the background monitoring operation may have been performed on only portions of the blocks to determine the corresponding optimal read voltage sets, but the optimal read voltage sets for the remaining blocks have not been determined. Once the solid state storage device 30 enters the idle mode again, the background monitoring operation is continuously performed on the remaining blocks to determine the corresponding optimal read voltage sets.

FIG. 4C is table illustrating the relationships between read voltage sets, uncorrectable codewords and error bits for deter for determining an optimal read voltage set. For example, the retry table 306 contains 9 read voltage sets. Consequently, after the background monitoring operation is performed on one block, 9 decoding results are generated. Please refer to FIG. 4C. In case that the first read voltage set is provided to read the data of the specified page, the number of the uncorrectable codewords is 8. In case that the second read voltage set is provided to read the data of the specified page, the number of the uncorrectable codewords is 0, and 706 error bits are generated. In case that the third read voltage set is provided to read the data of the specified page, the number of the uncorrectable codewords is 0, and 597 error bits are generated. In case that the fourth read voltage set is provided to read the data of the specified page, the number of the uncorrectable codewords is 0, and 614 error bits are generated. In case that the fifth read voltage set is provided to read the data of the specified page, the number of the uncorrectable codewords is 0, and 617 error bits are generated. In case that the sixth read voltage set is provided to read the data of the specified page, the number of the uncorrectable codewords is 6, and 247 error bits are generated. In case that the seventh read voltage set is provided to read the data of the specified page, the number of the uncorrectable codewords is 8. In case that the eighth read voltage set is provided to read the data of the specified page, the number of the uncorrectable codewords is 8. In case that the ninth read voltage set is provided to read the data of the specified page, the number of the uncorrectable codewords is 8.

As mentioned above, the data of the specified page cannot be successfully decoded by the ECC unit 304 according to the first, sixth, seventh, eighth and ninth read voltage sets. On the other hand, the data of the specified page can be successfully decoded by the ECC unit 304 according to the second, third, fourth and fifth read voltage sets. Since the number of the generated error bits and the number of the uncorrectable codewords according to the third read voltage set are the lowest, the third read voltage set can be considered as the optimal read voltage set. In this embodiment, the optimal read voltage set corresponding to the block is determined according to the optimized decoding efficacy. Consequently, the successful decoding probability of reading the block according to the optimal read voltage set is higher when compared with the successful decoding probability of using the other read voltage sets.

In the above embodiment, the background monitoring operation is performed on the specified block of one block. It is noted that numerous modifications and alterations may be made while retaining the teachings of the invention. In another embodiment, the background monitoring operation is performed on a portion of one block. For example, the background monitoring operation is performed on two pages of one block or the entire of one block.

For reading data from the solid state storage device 30, the controlling circuit 301 provides a default read voltage to the non-volatile memory 305. If the data is not successfully decoded, the controlling circuit 301 performs a read retry process.

Figure 4D:
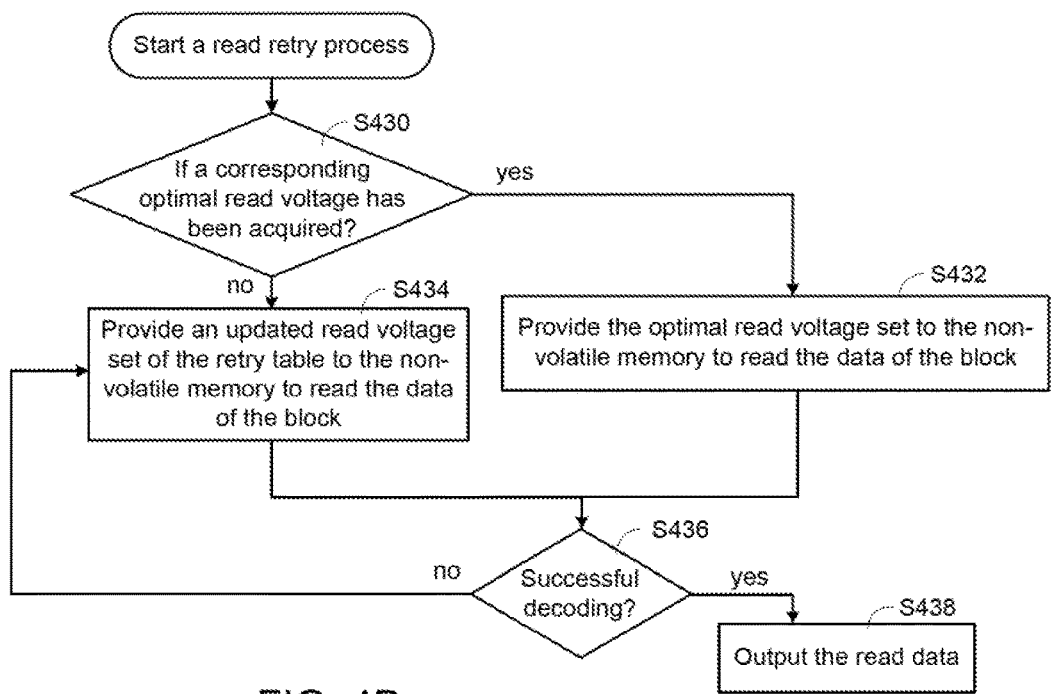
FIG. 4D schematically illustrates a flowchart of a read retry process according to a first embodiment of the present invention.

FIG. 4D schematically illustrates a flowchart of a read retry process according to a first embodiment of the present invention. Firstly, the controlling circuit 301 judges whether the background monitoring operation has been performed on the block to be read and judges whether an optimal read voltage set corresponding to the block has been acquired (Step S430). If the optimal read voltage set corresponding to the block has been acquired, the optimal read voltage set is provided to the non-volatile memory 305 in order to read data of the block (Step S432). Then, the controlling circuit 301 judges whether the data is successfully decoded (Step S436).

Whereas, if the judging result of the step S430 indicates that the optimal read voltage set corresponding to the block has not been acquired, it means that the background monitoring operation has not been performed on the block. Meanwhile, the controlling circuit 301 provides an updated read voltage set of the retry table 306 to the non-volatile memory 305 in order to read data of the block (Step S434). Then, the controlling circuit 301 judges whether the data is successfully decoded (Step S436).

If the controlling circuit 301 judges that the data is successfully decoded, the controlling circuit 301 outputs the read data (Step S438). Whereas, if the data is not successfully decoded, the step S434 is repeatedly done.

From the above descriptions, X read voltage sets have been previously stored in the retry table 306. While the read retry process is performed, if the optimal read voltage set corresponding to the block has been acquired, the optimal read voltage set is provided to the non-volatile memory 305 in order to read and decode the data of the block. If the optimal read voltage set corresponding to the block has not been acquired, the X read voltage sets of the retry table 306 are sequentially provided to the non-volatile memory 305 in order to read and decode the data of the block.

Moreover, during the idle period of the solid state storage device, the background monitoring operation is performed on all blocks of the non-volatile memory to determine the optimal read voltage sets of all blocks. While the read retry process is performed, the optimal read voltage set is preferentially used to read the data of the corresponding block. Consequently, the data can be successfully decoded at a faster speed, and the number of times of performing the read retry process will be reduced.

The present invention also provides a method of creating plural read voltage sets in the retry table. The obtained read voltages sets can be used to judge the status of the non-volatile memory 305. Hereinafter, a method of creating plural read voltage sets in the retry table will be illustrated in more details.

After the solid state storage device 30 leaves the factory, if the solid state storage device 30 has been written and erased many times, the threshold voltage distribution curves of the storing state of all cells in the non-volatile memory 305 are possibly changed. Under this circumstance, the median threshold voltage is shifted, and the solid state storage device 30 is in a read failure condition. Generally, the read failure condition includes a program disturbance condition, a data retention condition or a read disturbance condition.

Generally, after the non-volatile memory 305 has been programed and erased many times, the performance of the cells is possibly deteriorated and the storing states of the cells are erroneously judged. Under this circumstance, the read failure condition is the program disturbance condition. Similarly, after the programed cells have been read many times, the performance of the cells is possibly deteriorated and the storing states of the cells are erroneously judged. Under this circumstance, the read failure condition is the read disturbance condition. Moreover, after the cells have been programmed and the data have been stored for a long time, the hot carriers in the cells are gradually lost and the storing states of the cells are erroneously judged. Under this circumstance, the read failure condition is the data retention condition.

For example, before solid state storage device 30 leaves the factory, the non-volatile memory 305 is subjected to various disturbance experiments. The changes of the read voltage sets of the non-volatile memory 305 are measured and analyzed. According to the analyzing result, plural read voltage sets for reading the non-volatile memory 305 are created and stored in the retry table 306.

A process of creating the read voltage sets in the data retention condition will be illustrated as follows. The processes of creating the read voltage sets in the program disturbance condition and the read disturbance condition are similar to the process of creating the read voltage sets in the data retention condition, and are not redundantly described herein.

Figure 5A:
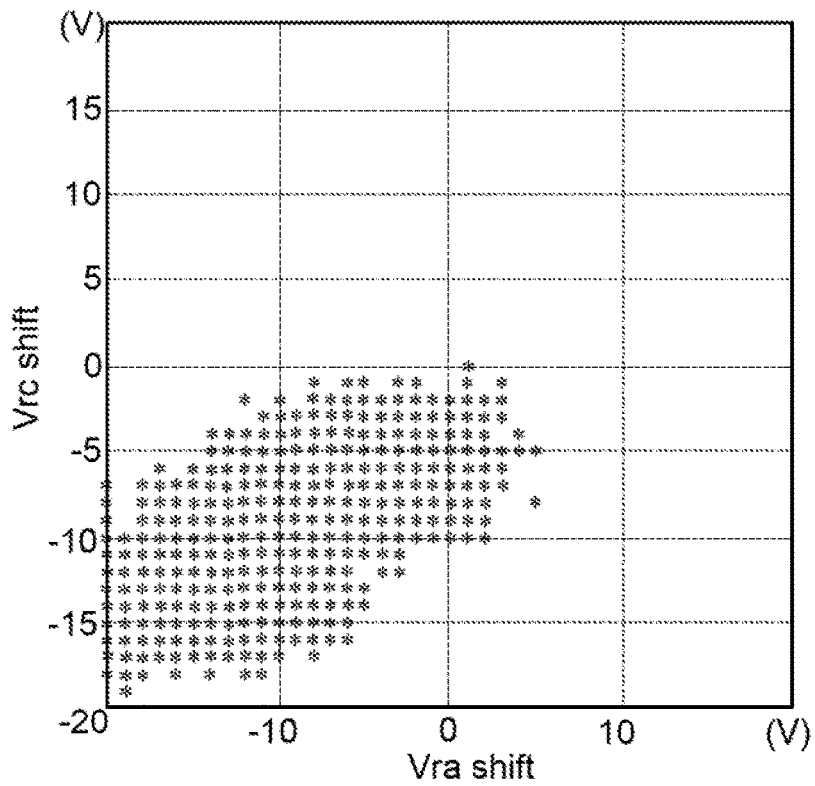
FIG. 5A is a schematic diagram illustrating the test result of the non-volatile memory in the data retention condition.

FIG. 5A is a schematic diagram illustrating the test result of the non-volatile memory in the data retention condition. In FIG. 5A, only the changes of the read voltages Vra and Vrc for the MLC flash memory are illustrated as examples. It is noted that the other read voltage Vrb can be tested by the similar approach.

In the data retention condition, plural cells of the non-volatile memory 305 at different storing time conditions are read, and their read voltages are measured. In FIG. 5A, the coordinate (0,0) indicates the location of the default read voltage set (Vra', Vrc'), the x-axis indicates the voltage shift between the measured read voltage Vra and the default read voltage Vra', and the y-axis indicates the voltage shift between the measured read voltage Vrc and the default read voltage Vrc'. Obviously, as the storing time increases, the read voltages Vra and Vrc gradually decrease and the voltage shifts gradually increase.

Figure 5B:
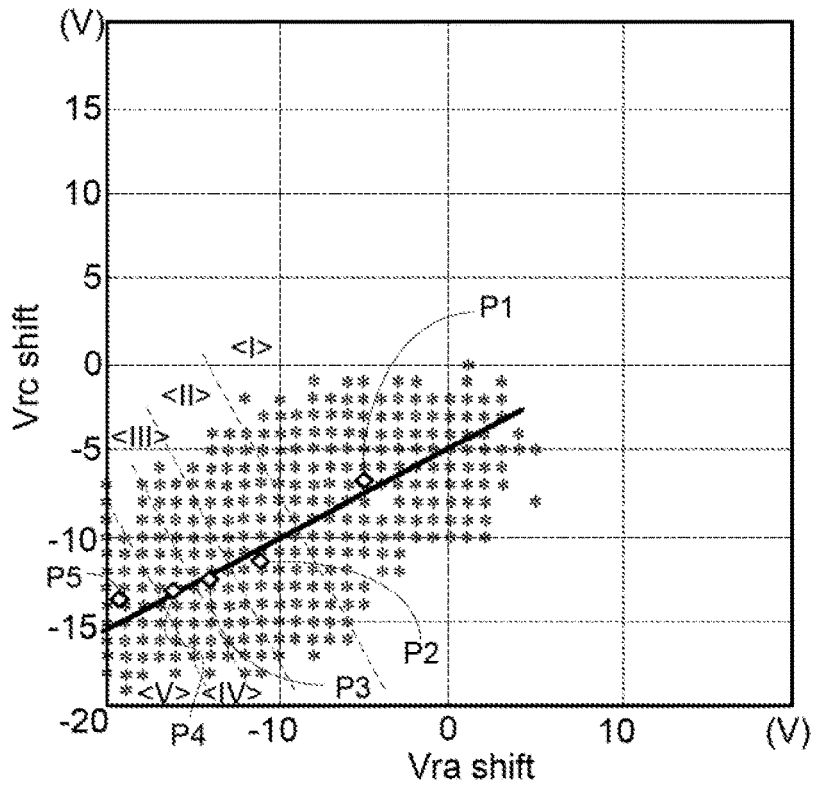
FIG. 5B illustrates the use of a group algorithm to divide the measured points of FIG. 5A into plural groups.

FIG. 5B illustrates the use of a group algorithm to divide the measured points of FIG. 5A into plural groups. As shown in FIG. 5B, the measured points are divided into five groups <I>, <II>, <III>, <IV> and <V>. The averages of the five groups are defined as main points P1, P2, P3, P4 and P5, respectively. In FIG. 5B, the main points are indicated by square marks. These five P1, P2, P3, P4 and P5 can be used as the five read voltage sets corresponding to the data retention condition and stored in the retry table 306.

The above method can be applied to create the read voltage sets in the program disturbance condition and the read disturbance condition. For example, five read voltage sets are created in the program disturbance condition, and five read voltage sets are created in the read disturbance condition. Consequently, a total of fifteen read voltage sets corresponding to different read failure conditions are stored in the retry table 306.

After the retry table 306 is established by the above method, the retry table 306 can be applied to the process of performing the background monitoring operation (see FIG. 4B). While the background monitoring operation is performed, the plural read voltage sets in the retry table 306 are provided to the non-volatile memory 305 by the controlling circuit 301. Consequently, the data of the specified page is read, and the corresponding decoding result is obtained. Then, the optimal read voltage set corresponding to the block is obtained according to the decoding result. As mentioned above, the retry table 306 is established by testing and analyzing the read voltage sets in different read failure conditions. After the background monitoring operation is performed to acquire the optimal read voltage sets of the corresponding blocks, the controlling circuit can realize the type of the read failure condition and the failure degree in order to activate a corresponding processing action.

For example, after the background monitoring operation is performed, the optimal read voltage set for a specified block is in the main point P3 of FIG. 3. Consequently, the controlling circuit 301 realizes that the read failure condition of the specified block is the data retention condition. Since the main point P3 is in the group <III>, the controlling circuit 301 can further realize the storing time condition of the specified block. For example, the main point P3 in the group <III> indicates that the data storing time exceeds a threshold value. Consequently, after the background monitoring operation is performed and the controlling circuit 301 realizes that the optimal read voltage set is in the group <III> of the data retention condition, the controlling circuit 301 can activate a proper processing action to improve the reading performance. For example, for avoiding data loss because of the long storing time, the controlling circuit 301 can perform a data moving action to move the data of the specified block to another block. Similarly, in response to another type of the read failure condition and a different failure degree, a corresponding processing action is activated. For example, after the background monitoring operation is performed and the optimal read voltage set for a specified block is in the program disturbance condition, the controlling circuit judges whether a program count and an erase count of the block exceed threshold values. If the program count and the erase count of the block exceed the threshold values, the controlling circuit 301 realizes that the specified block is not suitable for storing data and the controlling circuit 301 activates the corresponding processing action. For example, the controlling circuit 301 can perform a data moving action to move the data of the specified block to another block and perform a block marking action to make the block as an unavailable block.

From the above descriptions, the present invention provides a method of establishing the retry table. After the background monitoring operation is performed to acquire the optimal read voltage sets of the corresponding blocks, the controlling circuit can realize the type of the read failure condition and the failure degree in order to activate a corresponding processing action.

Moreover, the background monitoring operation is performed on a specified page of a block to acquire the optimal read voltage set. For reducing the variance between pages, some extension points based on the main points can be used to extend the read voltage sets. Consequently, the probability of successfully reading data can be increased, and the number of times of performing the read retry process will be reduced.

Figure 6A:
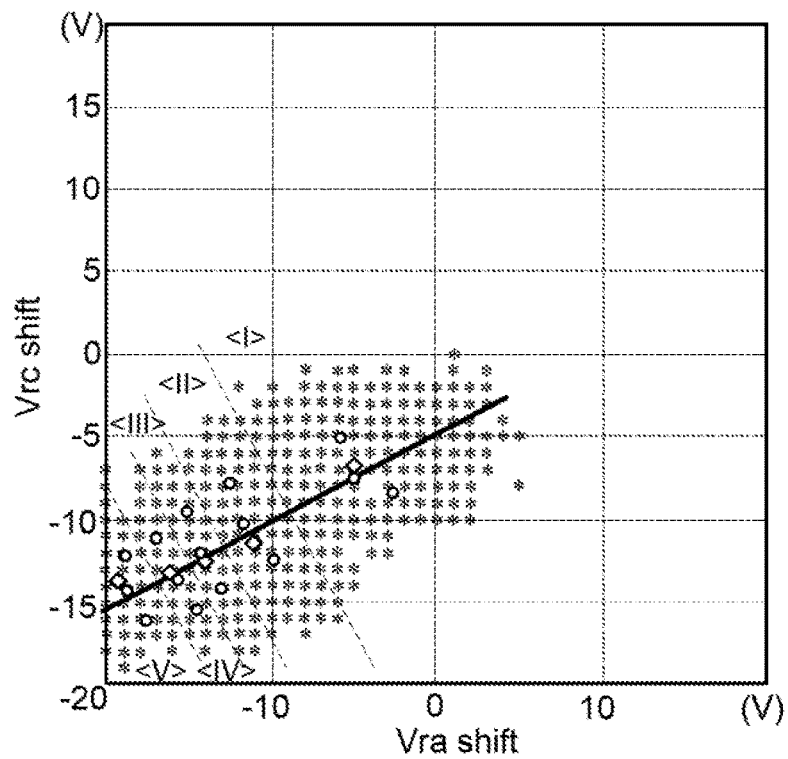
FIGS. 6A and 6B illustrate an approach of determining plural extension points according to the main points.

FIG. 6A illustrates an approach of determining plural extension points according to the main points. By using the group algorithm, the five main points as shown in FIG. 5B are further extended. In this embodiment, each main point is extended to obtain three extended points. In FIG. 6A, the main points are indicated by square marks, and the extended points are indicated by circular marks. In other words, there are fifth extended points in the five groups. The main points and the extended points are stored in the retry table 306.

Figure 6B:
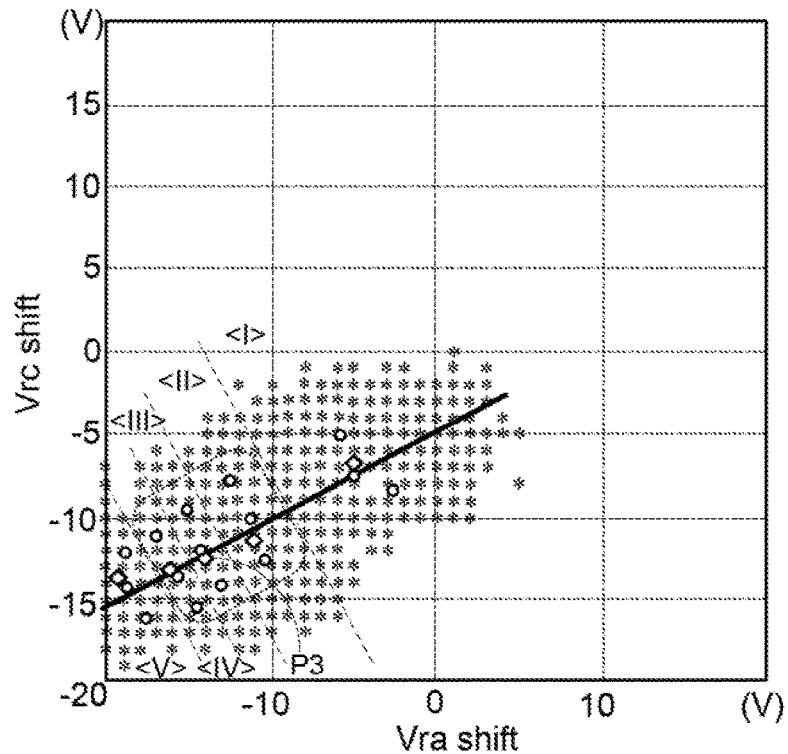

In case that the data cannot be successfully decoded according to the optimal read voltage set of the main point during the read retry process, the controlling circuit 301 further provides plural extended read voltage sets corresponding to the extended points near the main point. Consequently, an extended read retry process is performed. For example, as shown in FIG. 6B, the main point P3 corresponds to the optimal read voltage set. If the data cannot be successfully decoded according to the optimal read voltage set of the main point P3 during the read retry process, the read voltage sets of the nine extended points neighboring the main point P3 (i.e. the points circumscribed by the dotted lines) are used to perform the extended read retry process. It is noted that the number of the extended points neighboring each main point and the number of the extended points used in the extended read retry process are not restricted.

Figure 7:
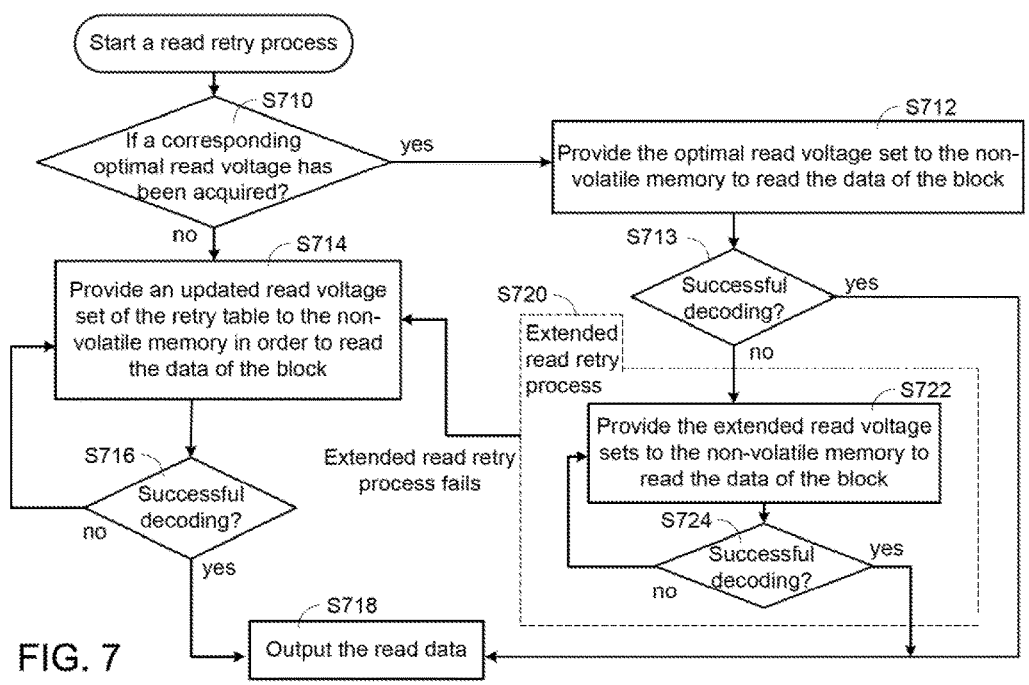
FIG. 7 schematically illustrates a flowchart of a read retry process according to a second embodiment of the present invention.

FIG. 7 schematically illustrates a flowchart of a read retry process according to a second embodiment of the present invention. In comparison with the first embodiment shown in FIG. 4D, the read retry process of this embodiment further comprises an extended read retry process (Step S720).

For example, X (e.g., X=15) read voltage sets are stored in the read retry table 306, wherein each read voltage set corresponds to N (e.g., N=9) extended read voltage sets.

Firstly, the controlling circuit 301 judges whether the background monitoring operation has been performed on the block to be read and judges whether an optimal read voltage set corresponding to the block has been acquired (Step S710). If the optimal read voltage set corresponding to the block has been acquired, the optimal read voltage set is provided to the non-volatile memory 305 in order to read data of the block (Step S712). Then, the controlling circuit 301 judges whether the data is successfully decoded (Step S713). If the controlling circuit 301 judges that the data is successfully decoded in the step S713, the controlling circuit 301 outputs the read data (Step S718).

Whereas, if the data is not successfully decoded in the step S713, an extended read retry process is started (Step S720). During the extended read retry process, the N extended read voltage sets corresponding to the optimal read voltage set are sequentially provided to the non-volatile memory 305 by the controlling circuit 301 to read and decode the data of the block (S722).

After the step S722, the controlling circuit 301 judges whether the data is successfully decoded (Step S724). If the controlling circuit 301 judges that the data is successfully decoded according to the extended read voltage sets, the controlling circuit 301 outputs the read data (Step S718), and the extended read retry process is ended. Whereas, if the controlling circuit 301 judges that the data is not successfully decoded according to all of the extended read voltage sets, it means that the extended read retry process fails. Then, a step S714 is performed. In other words, the steps S722 and S724 are performed N times at most during the read retry process.

Whereas, if the judging result of the step S710 indicates that the optimal read voltage set corresponding to the block has not been acquired, it means that the background monitoring operation has not been performed on the block. Meanwhile, the controlling circuit 301 provides an updated read voltage set of the retry table 306 to the non-volatile memory 305 in order to read data of the block (Step S714). Then, the controlling circuit 301 judges whether the data is successfully decoded (Step S716).

If the controlling circuit 301 judges that the data is successfully decoded in the step S716, the controlling circuit 301 outputs the read data (Step S718). Whereas, if the data is not successfully decoded in the step S716, the step S714 is repeatedly done.

As mentioned above, if the optimal read voltage set has been acquired, the optimal read voltage set is firstly provided to the non-volatile memory during the read retry process. If the data is not successfully decoded, extended read voltage sets are further provided to the non-volatile memory during the extended read retry process. Consequently, the successful decoding probability is increased.

From the above descriptions, the present invention provides a solid state storage device and a reading control method thereof. During the idle period of the solid state storage device, the background monitoring operation is performed on all blocks of the non-volatile memory to determine the optimal read voltage sets of all blocks. While the read retry process is performed, the optimal read voltage set is preferentially used to read the data of the corresponding block. Consequently, the successful decoding probability is increased, and the number of times of performing the read retry process will be reduced.

Moreover, the background monitoring operation is performed on a specified page of a block to acquire the optimal read voltage set. For reducing the variance between pages, some extension points based on the main points can be used to extend the read voltage sets. Consequently, the probability of successfully reading data can be increased, and the number of times of performing the read retry process will be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A reading control method for a solid state storage device, the solid state storage device comprising a non-volatile memory with a first block and a second block, the reading control method comprising steps of:
   performing a background monitoring operation on the first block for determining a first optimal read voltage set for the first block while the solid state storage device is in an idle mode, comprising:
      selecting a specified page of the first block;
      providing X read voltage sets stored in a retry table for reading the specified page of the first block, and correspondingly generating X decoding results; and
      determining one of the X read voltage sets as the first optimal read voltage set corresponding to the first block according to the X decoding results, wherein the first optimal read voltage set has a corresponding decoding result with a least number of uncorrectable codewords and a least number of error bits;
   reading the first block based on a default read voltage in a normal mode, and judging whether the first block is successfully read; and
   performing a read retry process on the first block with the first optimal read voltage set if the first block is not successfully read with the default read voltage set;
   wherein the X read voltage sets are previously stored in the retry table, X is a positive integer that is equal to or greater than 2.

2. The reading control method as claimed in claim 1, wherein the X read voltage sets in the retry table are corresponding to different read failure conditions.

3. The reading control method as claimed in claim 2, wherein the read failure condition includes a program disturbance condition, a data retention condition, or a read disturbance condition.

4. The reading control method as claimed in claim 2, further comprising steps of:
   realizing a type of the read failure condition and a failure degree corresponding to the first block according to the first optimal read voltage set; and
   judging whether a processing action is performed according to the type of the read failure condition and the failure degree.

5. The reading control method as claimed in claim 1, further comprising performing an extended read retry process on the first block if the first block is not successfully read according to the first optimal read voltage set, wherein at least one extended read voltage set corresponding to the first optimal read voltage set is previously stored in the retry table for used in the extended read retry process.

6. A solid state storage device, comprising:
   a non-volatile memory comprising plural blocks, wherein the plural blocks comprise a first block and a second block; and
   a controlling circuit connected with the non-volatile memory, wherein the controlling circuit comprises an error correction unit and a retry table, and plural read voltage sets are stored in the retry table;
   wherein the controlling circuit performs a background monitoring operation to determine a first optimal read voltage set corresponding to the first block while the solid state storage device is in an idle mode, the background monitoring operation comprising:
      selecting a specified page of the first block;
      providing the plural read voltage sets stored in the retry table for reading the specified page of the first block, and correspondingly generating plural decoding results; and
      determining one of the plural read voltage sets as the first optimal read voltage set corresponding to the first block according to the plural decoding results, wherein the first optimal read voltage set has a corresponding decoding result with a least number of uncorrectable codewords and a least number of error bits; and
   wherein the plural read voltage sets are previously stored in the retry table.

7. The solid state storage device as claimed in claim 6, wherein while the background monitoring operation is performed, the plural read voltage sets in the retry table are provided to the non-volatile memory to read a specified page of the first block, and plural decoding results are correspondingly generated by the error correction unit.

8. The solid state storage device as claimed in claim 6, wherein the plural read voltage sets in the retry table are corresponding to different read failure conditions.

9. The solid state storage device as claimed in claim 8, wherein the read failure condition includes a program disturbance condition, a data retention condition, or a read disturbance condition.

10. The solid state storage device as claimed in claim 8, wherein the controlling circuit further realizes a type of the read failure condition and a failure degree corresponding to the first block according to the first optimal read voltage set, and judges whether a processing action is performed according to the type of the read failure condition and the failure degree.

11. A reading control method for a solid state storage device, the solid state storage device comprising a non-volatile memory with plural blocks, the plural blocks comprising a first block and a second block, the reading control method comprising steps of:
   performing a background monitoring operation on the first block for determining a first optimal read voltage set while the solid state storage device is in an idle mode, wherein the background monitoring operation is performed by steps of:
      providing X read voltage sets stored in a retry table for reading the first block, and correspondingly generating X decoding results, wherein X is a positive integer equal to or greater than 2, and the X read voltage sets are previously stored in the retry table; and
      determining one of the X read voltage sets as the first optimal read voltage set corresponding to the first block according to the X decoding results, wherein the first optimal read voltage set has a corresponding decoding result with a least number of uncorrectable codewords and a least number of error bits; and
   performing a read retry process with the first optimal read voltage set to read the first block.

12. The reading control method as claimed in claim 11, wherein the X read voltage sets in the retry table are corresponding to different read failure conditions.

13. The reading control method as claimed in claim 12, further comprising steps of:
   realizing a type of the read failure condition and a failure degree corresponding to the first block according to the first optimal read voltage set; and
   judging whether a processing action is performed according to the type of the read failure condition and the failure degree.

14. The reading control method as claimed in claim 11, further comprising steps of:
   providing a default read voltage set to the non-volatile memory to read the first block in a normal mode, and judging whether the first block is successfully read; and
   performing the read retry process on the first block if the first block is not successfully read with the default read voltage set.

* * * * *